United States Patent [19]

Bartuska et al.

[11] Patent Number: 4,940,942
[45] Date of Patent: Jul. 10, 1990

[54] METHOD AND APPARATUS FOR CONDUCTING VARIABLE-TEMPERATURE SOLID STATE MAGNETIC RESONANCE SPECTROSCOPY

[76] Inventors: Victor J. Bartuska, 1600 Brentford La.; David H. Lewis, 502 N. Shields, both of Fort Collins, Colo. 80521

[21] Appl. No.: 339,053

[22] Filed: Apr. 14, 1989

[51] Int. Cl.$^5$ ............................................. G01R 33/20
[52] U.S. Cl. ..................................... 324/321; 324/307
[58] Field of Search ............... 324/300, 307, 309, 318, 324/321, 322; 128/653; 23/230 PC

[56] References Cited

U.S. PATENT DOCUMENTS

| | | | |
|---|---|---|---|
| 4,301,410 | 11/1981 | Wind et al. | 324/307 |
| 4,306,878 | 12/1981 | Brown et al. | 23/230 PG |
| 4,510,450 | 4/1985 | Brown | 324/321 |

OTHER PUBLICATIONS

Mathias et al., "A Low-Volume Insert For Solid State Magic Angle Spinning NMR of Small Samples," J. Magn. Reson. V 77 (3) pp. 566–568.

Exxon Chem. Co., "A Cylindrical Rotor System for Solid-State NMR in a Controlled Atmosphere", J. Magn. Reson. V 69 (3), pp. 527–530.

Mueller et al., "An Application of Solid-State Magic-Angle Spinning Aluminum-27 NMR to the Study of Cement Hydration", J. Magn. Reson. V 57 (1), pp. 152–156, 1984.

Primary Examiner—Michael J. Tokar
Attorney, Agent, or Firm—Luke Santangelo

[57] ABSTRACT

A technique and design for variable-temperature magnetic resonance spectroscopy. Designs utilizing a separate gas for control of sample temperature confine temperature gradients away from the sample. Annular seals isolate a sample gas chamber along a rotor and avoid gas mixing and other sample temperature effects. Improved resolution by avoiding temperature gradients and independence of rotational speed from sample temperature is provided.

43 Claims, 7 Drawing Sheets

PRIOR ART | PRESENT INVENTION

METHOD AND APPARATUS FOR CONDUCTING VARIABLE-TEMPERATURE SOLID STATE MAGNETIC RESONANCE SPECTROSCOPY

BACKGROUND OF THE INVENTION

Generally the invention relates to the field of solid state magnetic resonance spectroscopy. More specifically, the invention relates to the narrow field of variable-temperature magnetic resonance spectroscopy of solids.

Magnetic resonance spectroscopy is an aspect of analytical chemistry which includes Nuclear Magnetic Resonance (NMR) spectroscopy. This technique is used to determine the characteristics of a particular material and to identify basic structures and compositions of that material. It is based upon the well-known fact that when substances are subjected to electromagnetic radiation of the correct frequency and orientation, they may respond by emitting radiation which is characteristic of the particular molecular and atomic structure of that substance. In order to sense this effect for substances in a solid state, the material must be rotated at high frequency in an intense magnetic field In addition, the temperature of the material may need to be accurately set.

Historically the technique of magnetic resonance spectroscopy was first developed in 1948 for materials in the liquid state. This development eventually lead to the Nobel Prize. As part of the technique for analyzing materials in the liquid state, the materials were placed in an intense magnetic field and at times rotated at frequencies of up to 100 hertz (6,000 rpm). While rotation is not fundamentally necessary to analyze liquids, it was developed as a technique to overcome experimental problems caused by gradients in the external magnetic field. Although analysis of substances in the solid state was attempted initially using similar techniques, solids simply do not react to that external stimuli as liquids do. Since NMR spectroscopy of materials in the liquid state was relatively simple and readily yielded valuable information, the field of liquids NMR moved rapidly away from the theory-based scientists who originated it to application-oriented persons. The techniques of liquid NMR simply became sufficiently understood that theorists were minimally involved.

Theorists did, however, remain interested in the difficulties encountered in the magnetic resonance of materials in the solid state and, in the mid 1960s fundamental breakthroughs occurred. These breakthroughs were based upon the realization that an important difference was necessary to achieve results with sufficient resolution. Simply put, it became generally understood that it was not enough to merely rotate the sampling in a magnetic field. Rather, the sample had to be oriented with respect to the magnetic field (the so called "magic angle") and that the sample had to be rotated at extremely high frequencies—on the order of many kilohertz (hundreds of thousands of rpm). Rather than only representing a change in degree with respect to the way liquids NMR was done, the very fast rotation of a solid sample was not necessitated by experimental difficulties as in liquids NMR. Instead, it was due to fundamental reasons which resulted in reducing the nuclear spin interactions of the material. This fundamental difference coupled with the application-oriented development of liquids NMR resulted in a separation between those persons skilled in the art in liquid state NMR and those skilled in the art of solid state magnetic resonance. Although related by the fact that both were based upon the general principle of magnetic resonance, those skilled in the two arts had little overlap; indeed, their technical backgrounds were unusually quite diverse.

As the technique of solid state magnetic resonance was refined, many practical difficulties were encountered. Many of these were of such a nature that they prevented broad scale commercial acceptance of solid state magnetic resonance for some time. While certain facets of solid state magnetic resonance became accepted, other facets posed peculiar difficulties. One of these areas was the field of variable-temperature solid state magnetic resonance. This field has only recently developed. One of the obstacles faced in its development is that of accurately and uniformly controlling the temperature of the solid material to be analyzed. Since virtually all samples in solid state magnetic resonance are spun through use of gas-driven rotors, it was only natural that those skilled in the art of solid state magnetic resonance focused on the gas drive to control sample temperature. While it seems simple enough to merely change the temperature of the spin gas or gases (frequently a bearing gas and a drive gas were separately supplied), this resulted in other problems.

Perhaps the primary difficulty in the approach of controlling temperature with the spin gases was the fact that changes in temperature also resulted in changes in the frequency of rotation. Not only was this due to variation in the density of the spin gas, but it was also due to the fact that the combination of pressures and temperatures involved approached that conducive to condensation of the spin gas at the colder temperatures and unacceptably decreased gas density at higher temperatures. In addition to these effects, the problems of impacting the temperatures of the electronics in the vicinity of the rotor and the magnet (typically held at superconducting temperatures) made variable-temperature solid state magnetic resonance spectroscopy a unique problem. As an example, prior to the present invention, temperature/rotational frequency values ranged from 20° C./8 Khz to −50° C./6 Khz to −150° C./2 Khz in spite of efforts by those skilled in the art to avoid any change in frequency over such a temperature range.

An additional problem encountered by those developing the field of variable-temperature solid state magnetic resonance spectroscopy was the problem of accurate and uniform temperature control of the sample. Since temperature sensing was primarily achieved by sensing the temperature of the gas supplied to the rotor, it was not a direct representation of the temperature of the sample. This aspect and others were explained in the article "Experimental Considerations in Variable-Temperature Solid State Nuclear Magnetic Resonance With Cross Polarization and MagicAngle Spinning" by James F. Haw, et al., 58 Analytical Chem. 3172 (1986). The many different effects present resulted in not only inaccurate sample temperature estimation but also in nonuniform sample temperature. To avoid this, those skilled in the art have been seeking to minimize and avoid any temperature gradient within the rotor, unlike the techniques of the present invention. The temperature non-uniformity also had a direct effect on signal resolution in variable-temperature work. While efforts were made to independently control the bearing gas temperature and the drive gas temperature to overcome some effects, this approach generally resulted in unacceptable nonuniformity of the sample temperature and thus signal resolution decay. Hence, those skilled in the art tried to avoid temperature gradients.

In order to solve these and other problems encountered in variable-temperature solid state magnetic resonance spectroscopy, the present invention was developed. By supplying a separate sample gas in a particular fashion, it was discovered not only that accurate temperature control and uniformity could be achieved within the sample itself, but also that the undesirable effect of sample temperature on rotational frequency could be virtually eliminated. In addition, the present invention provides a design which substantially enhances the energy and cost concerns of performing solid state magnetic resonance spectroscopy. In this regard, it should be understood that analysis occasionally entails running a sample for many days at an extremely cold temperature. Obviously the costs using conventional techniques could become a concern. In addition, in the event relatively expensive cryogenic gases are utilized to overcome the condensation limits of nitrogen, operational expenses for such analysis can become an important factor.

While the basis of the present invention could be considered to be relatively simple, it is a fact that those skilled in the art of solid state magnetic resonance failed to realize the proper combination and selection of elements to overcome the prior limitations. Although the implementing arts and elements of the present invention were available, those in the field focusing on the problem of proper sample temperature control had not been able to solve the problem. The preconception that spin gas temperatures were necessarily tied to sample temperature control resulted in those skilled in the art teaching away from the direction of the present invention. Those skilled in the art simply failed to realize that the problem lay in assuming that sample temperature was tied to spin gas temperature. While there had been substantial attempts by those skilled in the art at overcoming the problems of variable-temperature solid state magnetic resonance spectroscopy, until the present invention such attempts had not resulted in a complete solution to the problem. This seems especially highlighted by the fact that the present invention has been very well received by researchers in the field even though only nominal effort and funds have been spent to market it. These same researchers have also expressed disbelief that such a simple system works so effectively, was so readily at hand, and yet went unrealized by those skilled in the art.

SUMMARY OF THE INVENTION

Accordingly it is an object of the present invention to provide a design which controls the temperature of a solid state magnetic resonance sample more accurately. An object is to more accurately control the exact temperature at which the solid state sample is maintained. An object is also to increase the accuracy in sensing the actual temperature of a sample during magnetic resonance spectroscopy. Another object is to uniformly control the temperature of the solid state sample. An object is thus to restrict any temperature variations away from the material being analyzed.

It is a further object of the present invention to overcome the impact of temperature changes in a solid state magnetic resonance sample on the rotational frequency of that sample. An object is thus to achieve sample temperature extremes without unacceptably affecting the rotational speed of the sample.

A further object of the present invention is to separate the control of the temperature of a solid state magnetic resonance sample from the system for rotating that sample. An object is also to provide a design which will allow complete shutdown of the temperature control system without affecting the spinning system in a solid state magnetic resonance spectrometer. An object is to provide a design in which a sample temperature is controlled by a gas which is separate from the gases involved in the spin system of such a spectrometer. It is also an object to provide a design in which a temperature of a sample can be controlled through the use of a gas having a relatively low pressure when compared to the gases utilized in the spinning system.

It is a further object of the present invention to achieve energy and cost savings in the operation of variable-temperature solid state magnetic resonance spectrometers. An object is thus to avoid unnecessary energy control in such a spectrometer. Limiting the effect of temperature control of the sample to only the desired area is thus an object.

It is a further object of the present invention to provide a design which facilitates operation of variable-temperature solid state magnetic resonance spectrometers. In furthering this goal it is an object to utilize the gas exhaust system to ease practical operation of the spectrometer. An object is to combine exhaust gases and thus mix pressures and temperatures to result in conditions which minimize any adverse affect from the exhaust gases. In keeping with this general object, it is also a goal to provide a design which can be readily handled with minimal temperature adjustment times. It is thus an object to provide a design which separates the variable-temperature sample gas supply line from that of the spinning system.

BRIEF DESCRIPTION OF DRAWINGS

FIGS. 5a through 5c are graphic representations of the general temperature as it may exist along the central axis of the rotor during operation of the spectrometer.

DETAILED DESCRIPTION OF THE PREFERRED EMBODIMENTS

Figure 4:
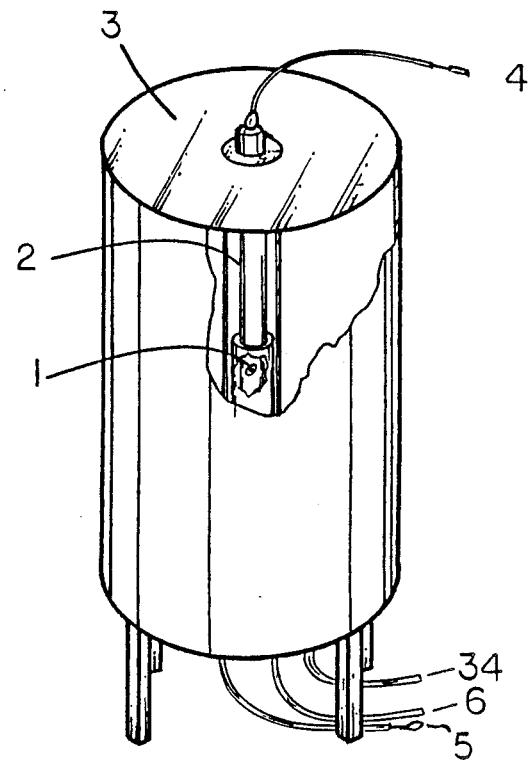
FIG. 4 is a perspective view of the probe assembly installed in a magnet housing as it exists during operation of the spectrometer.

As can be seen from the drawings, the basic concept of the present invention involves several different aspects. Referring first to FIG. 4, spin mechanism (1) can be seen placed ready for operation. Spin mechanism (1) is typically positioned within probe (2) which in turn is centrally located in magnet (3). In the preferred embodiment of the present invention, a sample gas is supplied through sample gas supply line (4). Spinning gases are supplied on the other end of probe (2) through drive gas supply line (5) and bearing gas supply line (6). A purge gas can be supplied through purge gas line (34) as well known in the art. In operation a solid state sample material is spun within spin mechanism (1) through operation of a drive gas supplied through drive gas supply line (5) and a bearing gas supplied through bearing gas supply line (6). The temperature of solid state sample material is controlled through sample gas supplied through sample gas supply line (4). Magnetic resonance emissions are then sensed within spin mechanism (1) and are electronically transmitted to the remainder of the spectrometer through wiring not shown.

Figure 2:
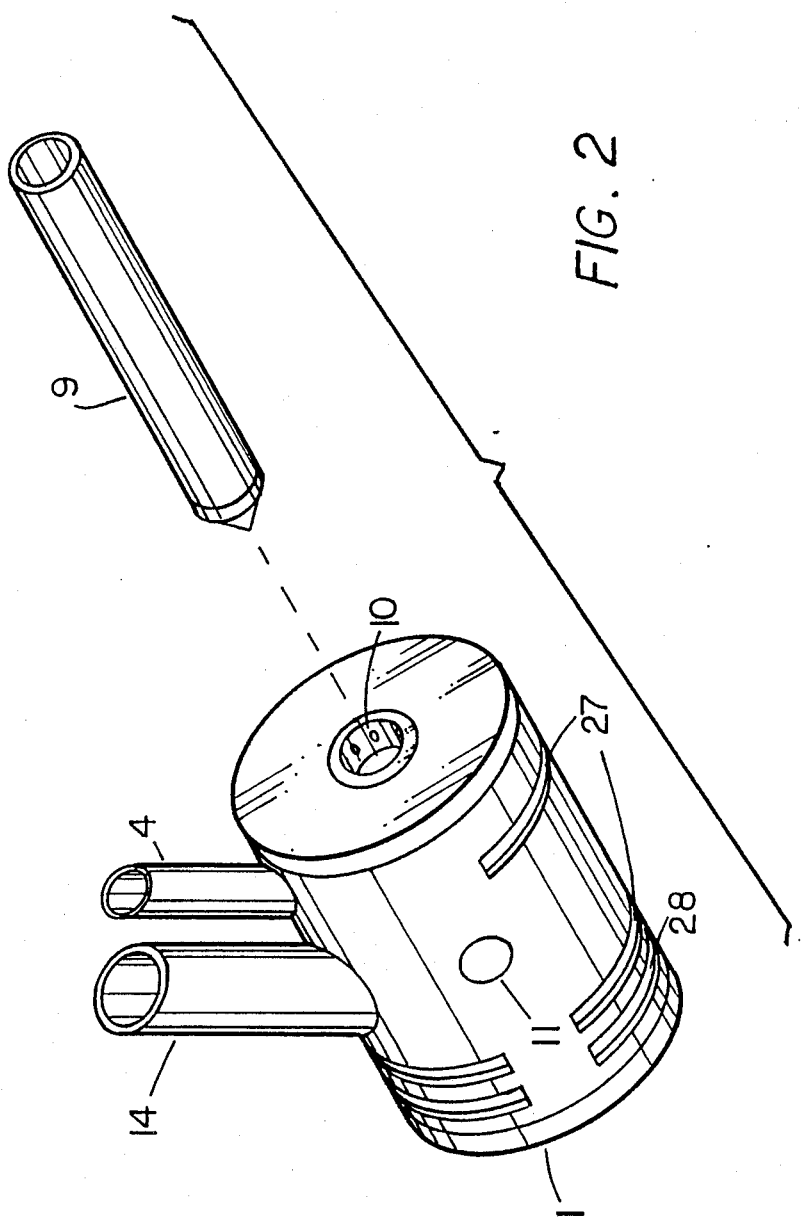
FIG. 2 is a perspective view of the spin mechanism shown in FIG. 1 detached from the probe and prior to installing the rotor.
Figure 3:
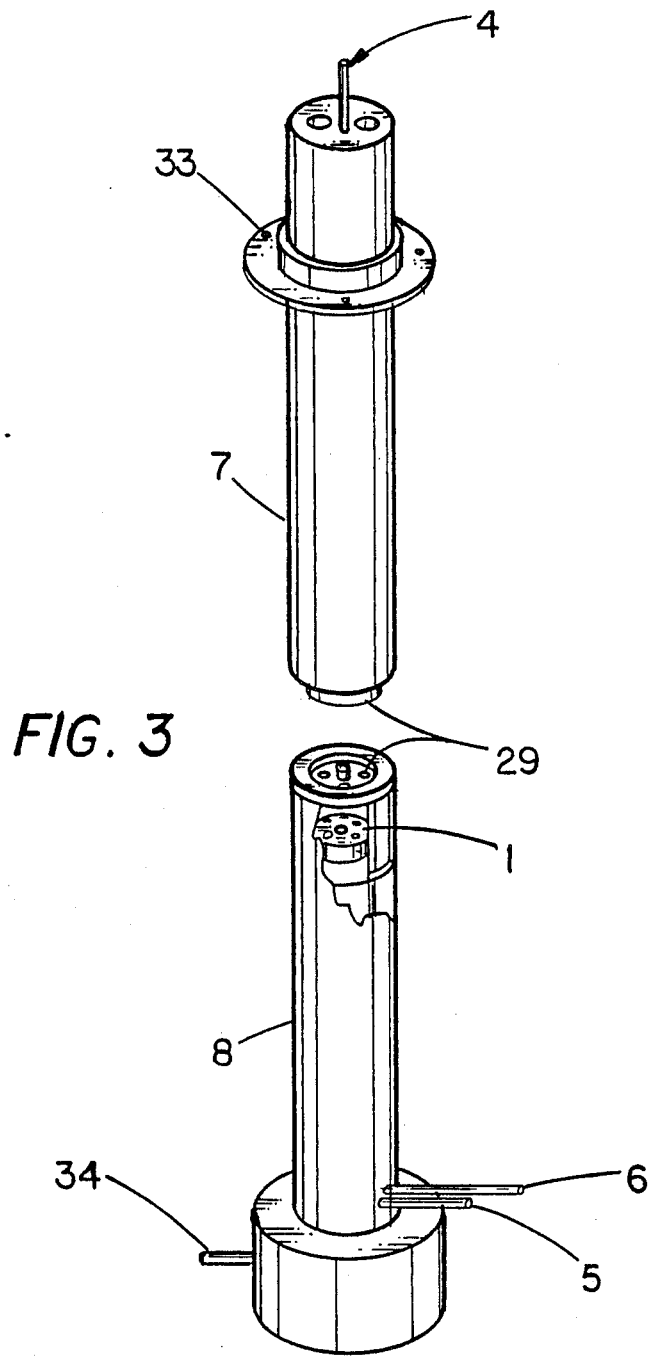
FIG. 3 is a perspective view of the probe assembly prior to connection.

Referring to FIG. 3, it can be seen that probe (2) disassembles into a fixed end (7) and a removable end (8). When assembled these ends house spin mechanism (1) and position it within magnet (3). As will be understood later, the supplying of gases through probe (2) is an aspect of the present invention. As part of the assembly process, solid state sample material must be placed within spin mechanism (1). As shown in FIG. 2, spin mechanism (1) is a housing designed specifically to accommodate rotor (9) which has a conical shape at one end. Rotor (9) is designed to contain solid state sample material and is easily placed within spin mechanism (1) by insertion through rotor port (10). Naturally rotor (9) could be a solid, machined shape of sample material. Rotor (9) is then spun through operation of spin gases. Rotor (9) is then held within spin mechanism (1) during operation through operation of the Bernoulli principle.

Figure 1:
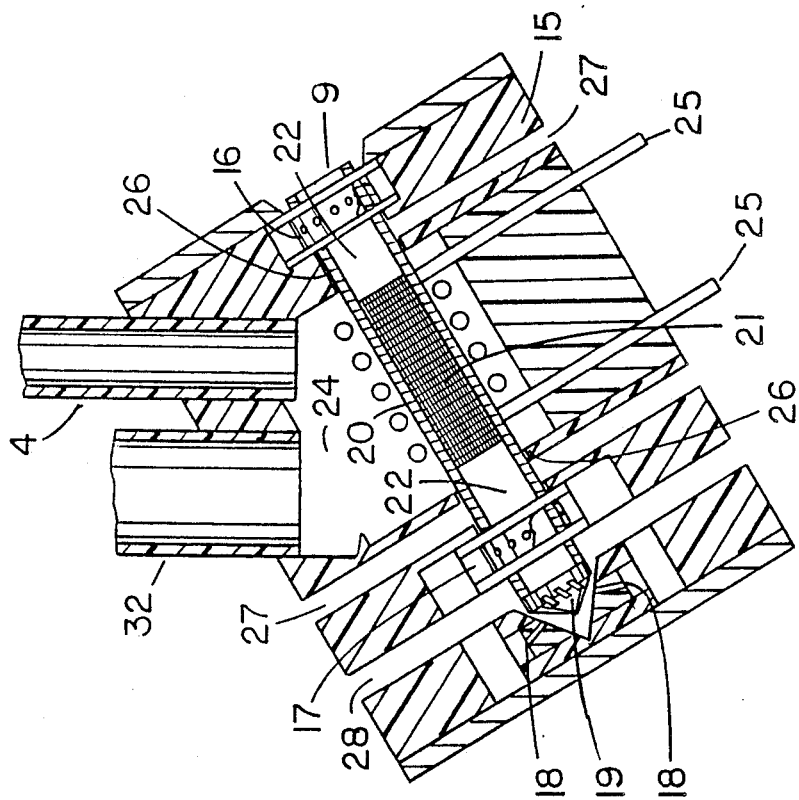
FIG. 1 is a cross sectional view of the preferred embodiment of the spin mechanism.

In FIG. 1 a cross sectional view of spin mechanism (1) with rotor (9) inserted is shown. Spin mechanism (1) surrounds rotor (9) and has various passageways within it to direct and supply both spin gases and sample gases to the proper areas of rotor (9). In attempting to discern location of these various passageways, it should be understood that such passageways are deleted from the cross sectional view of spin mechanism (1) except as related to sample gas to simplify understanding the primary concepts of the present invention. Since these passageways are routed in three dimensional space it is difficult to show them on the drawings supplied. Certainly the technique of providing such passageways is well known in the art and is further described in U.S. Pat. No. 4,511,841 involving the present inventors. As can be seen in FIG. 2, these passageways within spin mechanism (1) terminate in several ports or lines, for instance, drive gas supply port (11), sample gas supply line (4), and sample gas exhaust line (14). As is well understood in the art, drive gas supply port (11) and bearing gas supply port (not shown) are positioned on a middle axis of spin mechanism (1). This positioning not only structurally retains spin mechanism (1) in the proper position within probe (2) but it also allows adjustment of the angle of the central axis of rotor (9) with respect to the central axis of probe (2) and thus with respect to the magnetic field.

There are also passages within spin mechanism (1) to allow exhaust of the various gases. In the present embodiment these passages are merely slots in spin mechanism (1) termination on the surface. Each of these slots allows the appropriate gas to exit spin mechanism (1) freely since ducting is not required.

In reference to sample gas supply line (4) and sample gas exhaust line (14) it should be understood that these ports may be angularly positioned on spin mechanism (1). This angular positioning facilitates the typical angling of spin mechanism (1) with respect to magnetic field lines. This angling is typically adjusted about the "magic angle" of 54.7° as is well known in the art of solid state magnetic resonance spectroscopy. Connection of sample gas supply line (4) through probe (2) and into spin mechanism (1) at sample gas supply line (4) may be made through fixed or flexible connections. Similarly a sample gas exhaust line (14) may be provided. Since the preferred embodiment utilizes lower pressures for sample gas, loose connection of both sample gas lines is possible. As shown, sample gas exhaust line (14) has a larger diameter than sample gas supply line (4) in the preferred embodiment. This sizing is utilized to allow proper pressure to exist within sample chamber (24). In addition, both sample gas supply line (4) and sample gas exhaust line (14) slideably fit into spin mechanism (1). Not only does this allow for adjustment of the angle of spin mechanism (1) with respect to the magnetic field, but it also accommodates the thermal expansion and contraction occurring.

Referring again to FIG. 1, the cross section of spin mechanism (1) can be further understood. As can be seen, spin mechanism (1) includes stator housing (15). This stator housing may be in several pieces connected together. The central portion of stator housing (15) may be designed to accommodate an upper gas bearing (16), a lower gas bearing (17), and drive ports (18). Drive ports (18) act in conjunction with gas bearings (16 and 17) to achieve high speed rotation of rotor (9) as is well known in the art and a subject of the inventor's prior patent. Also as known in the art, rotor (9) includes a conical end (19) which connects to rotor cylinder (20) which contains solid state sample material (21). Solid state sample material (21) is placed within rotor (9) through use of spacers (22). Spacers (22) are preferably made of insulating material to enhance confinement of temperature gradients as discussed later. Important to the present invention is the inclusion of sample chamber (24) which is an annular chamber designed to encircle rotor (9) in the vicinity of solid state sample material (21). Within sample chamber (24), antenna (25) (shown as a coil in cross section) is included to sense magnetic resonance emissions. Finally, in understanding the features shown in cross section in FIG. 1, two annular stator seals (26) are provided.

Figure 8:
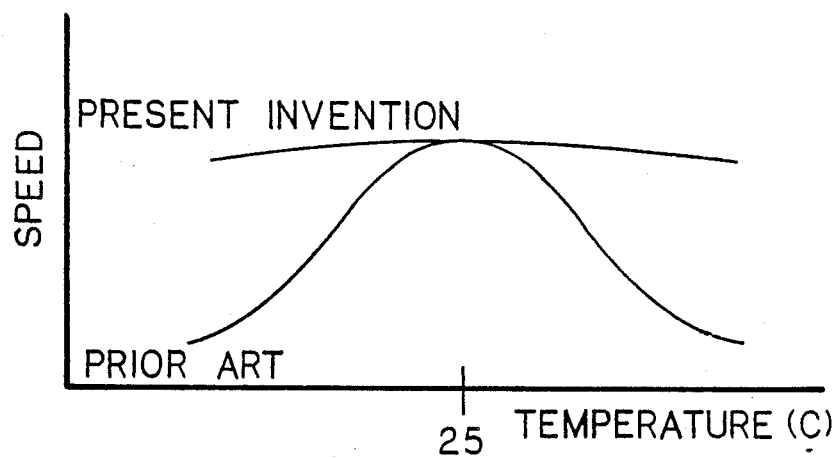
FIG. 8 is a graphic representation comparing the temperature effect on rotor speed for prior art apparatuses and for the present invention.

Operation of spin mechanism (1) can be understood as follows. First, a bearing gas is supplied to both upper gas bearing (16) and lower gas bearing (17). This bearing gas serves to isolate rotor (9) from any contact with stator housing (15) and to permit rotor (9) to freely rotate within stator housing (15). A drive gas is then supplied through drive ports (18) to act upon conical end (19) and cause rotation of rotor (9). In operation it should be understood that the need to rotate solid state sample material (21) at speeds in the vicinity of 400,000 rpm necessitates extreme pressure conditions. When combining this with the need to provide low temperatures, the possibility of condensation of the gas used (typically nitrogen) is possible as well as the reality of increased density of such gases. Since precise maintenance of the orientation of the central axis of rotor (9) is desirable, in some designs (although not in the present)

gas bearings (16 and 17) are also maintained to very close tolerances in close proximity to the surface of rotor cylinder (20). This close proximity further enhances the possibility of adverse effects due to gas condensation. Each of these aforementioned aspects attributes to the difficulties in maintaining a proper rotor speed as temperatures are varied. Until the present invention, the competing needs of maintaining a constant frequency of rotation, maintaining a high speed of rotation, and varying the temperature of solid state sample material (21) have necessarily resulted in trade offs. As can be seen in the characterization of FIG. 8, prior to the present invention the frequency of rotation has been very dependent on the temperature desired to be maintained. As shown for prior art, at low temperatures condensation and increased density resulted in greater frictional resistance to rotation of rotor (9) thus resulting in a slower speed as temperature was reduced. On the other end of the curve, as higher temperatures were utilized, the resulting thinning of the drive gas due to increased temperatures also resulted in slower rotational speeds. Since most designs have been optimized for room temperature environments, the optimum rotation speed (i.e. the highest rotational speed) has been centered in the vicinity of room temperature. The present invention substantially overcomes these limitations by making rotational speed largely independent of temperature over typical ranges.

The degree to which the present invention has been successful in overcoming this limitation of prior art is significant. As an example, and as stated earlier, it should be understood that in the prior art the speed of rotation could be decreased by as much as 75% over a typical temperature range. In extremely sharp contrast to this large variation, the present invention results in a reduction of such variations by almost two orders of magnitude. For instance, over the temperature range causing a 75% change in the speed of rotation in the prior art, the speed of rotation in the present invention varies only about one percent (1%). This extraordinary result has, perhaps more than anything, contributed to the initial disbelief that those skilled in the art experience when the performance of the present invention is explained.

Referring back to FIG. 1, the reason that the present invention provides such extraordinary differences from the prior art can be best understood. As explained earlier, sample gas is supplied through sample gas supply line (4) to sample chamber (24). This supply is independent of either of the spin gases, the drive gas or the bearing gas. As such both drive gas and bearing gas can be maintained at the optimum pressures or temperatures to maximize rotation of rotor (9). Significant to the present invention is not only the fact that the temperature of solid state sample material (21) is maintained by a separate gas, but also that such gas is isolated and largely confined to only sample chamber (24). This is accomplished through providing a separate sample gas exhaust line (14) directly to sample chamber (24). Since both bearing and drive gases have their own separate exhaust ports, the tendency of sample gas to mix with either of the other gases is minimized. Use of separate sample gas also enhances direct control of sample temperature by increasing the relative proportion of convective energy transfer. This can be important since prior art devices rely to a significant degree on conduction through the rotor to control sample temperature. In addition to providing a separate exhaust system, the present embodiment includes annular stator seals (26). These two seals entirely surround rotor (9) and may be designed (as in the present invention) to provide a closer tolerance fit in the vicinity of rotor (9) than either of the gas bearings (16 or 17) and may have bearing gas exhaust port (27) positioned in between it and the bearing. In this fashion the natural tendency of bearing gas is to exhaust through the bearing exhaust port (27) and for drive gas to exhaust through drive exhaust port (28). This confines the changes in temperature over the length of rotor (9) to areas away from solid state sample material (21).

An additional aspect of sample gas is that it may be supplied at lower pressure than that necessary to optimize either the bearing means or the rotation means. By supplying sample gas at lower pressure, connection to spin mechanism (1) is not only facilitated but the friction of rotor (9) with respect to sample gas is minimized. A practical effect of utilizing lower pressures and lower gas flows to control the temperature of solid state sample material (21) and of confining this temperature to only the area of solid state sample material (21) is that both the energy necessary and the cost of supplying such energy are minimized. This affect can be of very practical importance when it is considered that samples might be run as long as three days at $-150°$ C.

Figure 5A:
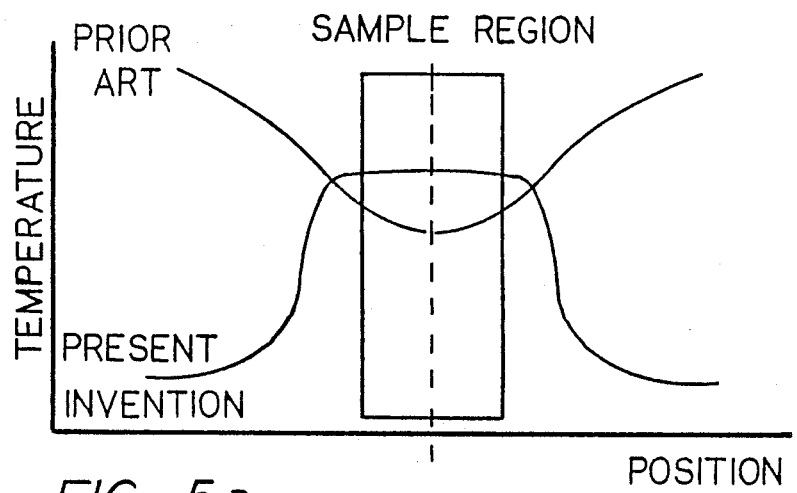
Figure 5B:
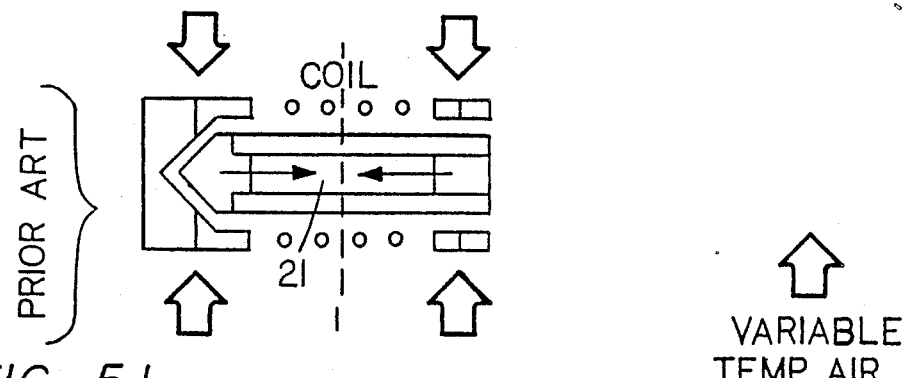

Referring to FIGS. 5a through 5c, an additional aspect of the present invention can be understood. As shown in the figures, in prior art devices which control the temperature of solid state sample material (21) by controlling the temperature of either or both the spin gases, inaccurate temperature sensing and nonuniform temperature distribution has resulted. Each of these effects is described in detail in the article by Haw mentioned earlier. With respect to inaccurate temperature sensing, it should be understood that the sensor of the sample temperature is actually a sensor of the temperature of the spin gas supply for prior art devices. Because the magnetic resonance emissions must be detected in close proximity to solid state sample material (21), and because the electronics of the sensors employed to sense temperature would interfere with this and other signals involved, it is typical that the temperature sensor must be placed at some distance from solid state sample material (21). As explained in the Haw article, this results in inaccurate temperature estimations, in part due to Joule-Thompson cooling and other effects. Particularly when the temperature of the bearing gas is not equal to the temperature of the drive gas, the mixing that occurs can also increase the difference between actual solid state sample material temperature and the temperature sensed and make extrapolation errors larger. As explained in the Haw article, these variations can result in the actual temperature of the sample being as much as almost 35° C. different from that sensed. The isolation of sample gas from the spin gases in the present invention obviously minimize this uncertainty.

In addition to the inaccuracy of the temperature sensing in the prior art devices, there also existed a temperature gradient within solid state sample material (21). Again, as explained in the Haw article, this temperature gradient has been extremely undesirable. Referring to FIGS. 5a through 5c and to FIGS. 7a through 7d, the effect of this temperature gradient can be best understood from seeing the effect of temperature on a representative signal. FIG. 5a overlays the temperature within rotor (9) as a function of position along with axis of the rotor. Graphically this position is shown for prior art system shown in FIG. 5b and in the present invention shown in FIG. 5c. As can be see the use of variable temperature air to drive the rotor (9) shown in FIG. 5b results in temperature variation within solid state sample material (21). While some variation also exists for the temperature within solid state sample material (21) of rotor (9) as shown in FIG. 5c, this variation is substantially reduced. An additional aspect is that in order to achieve desired temperatures within solid state sample material (21) in the prior art, the temperature of spin gases may need to be substantially varied from the optimum temperature for proper rotation. The difference between the temperature of the spin gases in the prior art and in the present invention are graphically shown in FIG. 5a and substantially impact the speed of rotation for given temperatures as mentioned earlier.

Figure 6C:
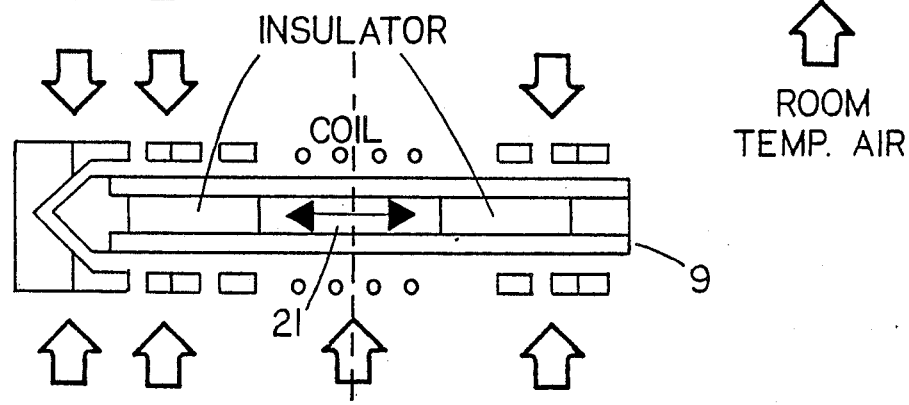
FIGS. 6a and 6b are comparisons of the representative temperature gradients across the sample as it exists in prior art apparatuses and the present invention.
Figure 6A:
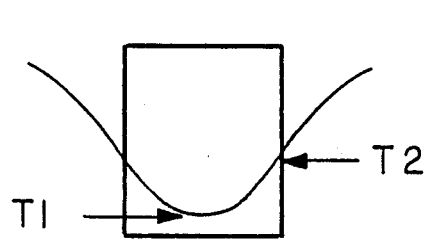
Figure 6B:
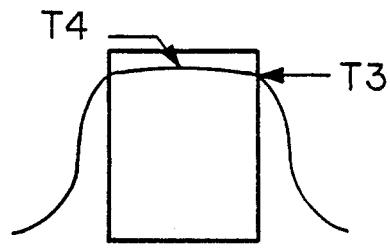
Figure 7A:
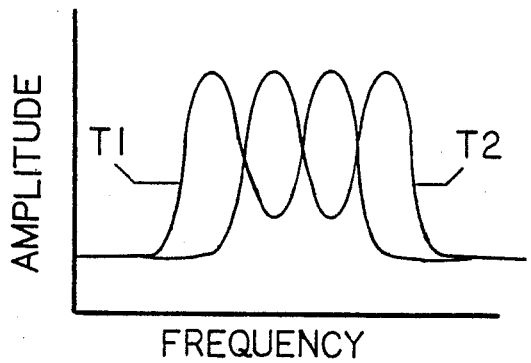
FIGS. 7a through 7d are graphic representations of the general temperature effect on a given magnetic resonance signal.
Figure 7B:
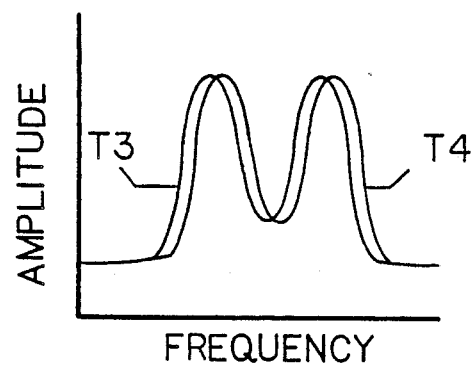

Referring to FIGS. 7a through 7d and FIGS. 6a and 6b, the impact on these temperature gradients can be better understood. In FIGS. 6a and 6b, the lowest and highest temperatures for the prior art sample are listed as T1 and T2 and for the present invention as T3 and T4. In FIGS. 7a and 7b, a representative signal at the various temperatures is shown. As can be seen, a signal shift results with temperature changes. This signal shift is in essence a shift along the horizontal axis of a given signal.

Figure 7C:
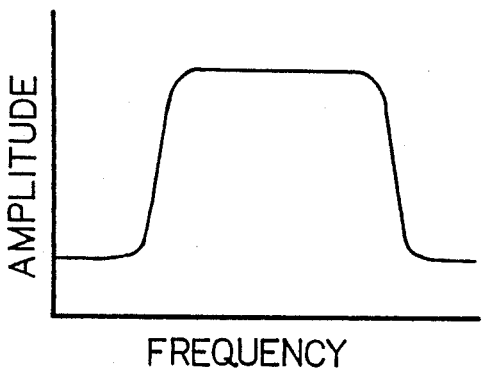
Figure 7D:

Referring to FIGS. 7a through 7d, the effect of having more than one temperature exist within solid state sample material (21) can be seen as it might exist in the prior art. In FIG. 7c the prior art shows in essence a signal similar to that shown in FIG. 7a which is actually the average of the two different temperatures. Since fine features can exist in a signal and can be of fundamental importance in understanding the characteristics of the material being analyzed, the effect of the temperature shift can result in masking the features of a signal as shown in FIG. 7c for the prior art. The present invention avoids this difficulty by isolating and confining the majority of any temperature gradients which might exist to areas away from solid state sample material (21). Thus, the resolution necessary to sense fine features of the representative signal can be possible because all of the solid state sample material (21) would be very close to a single uniform temperature.

In further understanding the degree to which the present invention overcomes this temperature gradient problem, an estimate of the actual temperature of the rotor as a function of the position along its central axis is helpful. Referring to FIGS. 5a through 5c, such an effect as estimated for prior art is shown as compared to the effect as estimated for the present invention. As shown in a prior art device in which the sample temperature is controlled through one or both of the spin gases, it can be seen that temperature changes exist throughout the central axis of rotor (9). Since at the ends of rotor (9) both bearing and drive gases are supplied, the temperatures of the rotor in this vicinity are that necessary to maintain the solid state sample material (21) at roughly the desired temperature. Thus the temperature of rotor (9) in this area may not be the optimum temperature necessary to produce optimum rotation of rotor (9). As can be seen from the curve representative of the prior art, the temperature constantly changes along the central axis of rotor (9). This results in temperature gradients within solid state sample material (21). While efforts have been made to minimize the temperature gradient existing within the sample, such efforts have not been successful to the degree necessary. As shown on the curve representative of the present invention, not only can it be seen that the temperature at the ends of the rotor might be optimized for the best rotation of rotor (9), but also it can be seen that temperature gradient is largely restricted away from the areas of solid state sample material (21). The confinement of temperature gradient in this fashion is of fundamental importance to the present invention as it affords the independence of the control of the temperature of solid state sample material (21) from the temperature of spinning the spinning gases.

A separate feature of the present invention is the manner in which the various gases are supplied to spin mechanism (1). As can be seen in reference to FIGS. 3 and 4, both bearing gas and drive gas are supplied to one side of probe (2) and that sample gas is supplied to the other side of probe (2). This affords the practical result of allowing the effects of the extremes of temperature of the sample gas to be isolated to one side of probe (2). In so doing these effects—which can include effects on electronics, sealed fittings, and flexible tubing—are isolated. Since fixed end (7) of probe (2) is designed to be mounted through mounting ring (33), it need not be constantly removed and replaced when changing samples or conducting a series of experiments. Feeding sample gas supply line (4) through fixed end (7) avoids the attendant difficulties and time consuming waiting period inherent in other designs. Conversely, providing both bearing gas supply line (6) and drive gas supply line (5) through the moveable end (8) of the probe (2) facilitates manipulation of probe (2) during experiments and also isolates any temperature transfers from one gas to another. This can be important since optional spin gases are supplied at room temperature as mentioned earlier. Naturally this feature can be achieved with and without the other aspects of the present invention. An additional attribute of the preferred embodiment is that it allows the capability of combining exhaust gases to facilitate handling. Since the gases are supplied at varying pressures and temperatures, the combination of all gases into one pathway facilitates their mixing and thus avoids any extremes in temperature or pressure in ducting exhaust gases away from spin mechanism (1). As is shown in FIG. 3, the exhaust gases are easily combined at junction (29). The combined exhaust gas may then be carried away in a separate exhaust tube or merely through the remaining space within probe (2) as shown.

Figure 9:
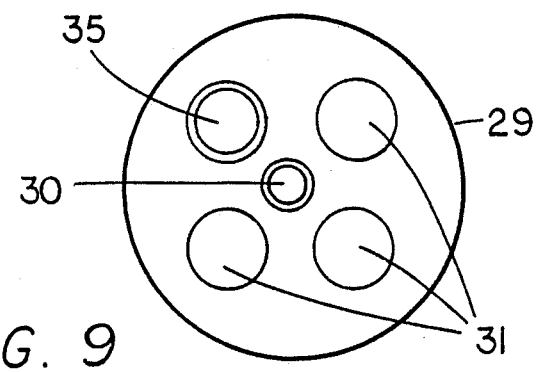
FIG. 9 is a top view of the exhaust gas junction in the vicinity of the spinning mechanism.

In achieving the effect of eliminating extreme conditions, it is believed that the cross sectional area of exhaust tube or duct should be at least as large as the sum of the cross sectional areas of all other gas supply lines. Referring to FIG. 9, a cross section of junction (29), it can be seen that cross sectional area (30) of sample gas supply line (4) is much smaller than that of exhaust gas junction orifices (31) and cross section of sample gas exhaust tube (35). In addition, in the preferred embodiment the entire remaining internal area of fixed end (7) of probe (2) is used to duct exhaust gas away from spin mechanism (1). In the preferred embodiment sample gas exhaust tube (32) is utilized to directly duct the exhaust of sample gas into junction (29). Since in the preferred embodiment sample gas is supplied at relatively low pressures, this isolates the sample gas from the higher pressure environment of both bearing and drive gases until such gases are combined and affected by the larger cross sectional area existing past junction (29). Naturally other variations of this general technique are possible dependent upon the specific designs utilized.

The foregoing discussion and the claims which follow describe the preferred embodiment of the present invention. Particularly with respect to the claims, it should be understood that changes may be made to the invention without departing from its essence. In this regard it is intended that such changes would still fall within the scope of the present invention. It simply is not practical to describe and claim all possible revisions to the present invention which may be accomplished. To the extent such revisions utilize the essence of the present invention, each would naturally fall within breadth of protection encompassed by this patent. This is particularly true for the present invention since basic concepts and understandings are in basis.

We claim:

1. A method of performing variable-temperature, solid state magnetic resonance spectroscopy comprising the steps of:
   a. placing a solid state sample in a rotor;
   b. positioning said rotor within a magnetic field;
   c. spinning said rotor through operation of at least one spinning gas;
   d. creating a temperature gradient among the gases surrounding said rotor to impact the temperature of said solid state sample;
   e. affirmatively confining said temperature gradient to areas of the rotor away from said solid state sample; and
   f. reading the magnetic resonant emissions of said sample.

2. A method of performing variable-temperature, solid state magnetic resonance spectroscopy as described in claim 1 and further comprising the step of controlling the temperature of said solid state sample independently of said spinning gas.

3. A method of performing variable-temperature, solid state magnetic resonance spectroscopy as described in claim 2 wherein said spinning gas comprises a drive gas and a bearing gas.

4. A method of performing variable-temperature, solid state magnetic resonance spectroscopy as described in claim 3 wherein said step of controlling the temperature of said solid state sample comprises subjecting said sample to a separate sample gas.

5. A method of performing variable-temperature, solid state magnetic resonance spectroscopy as described in claim 4 wherein said step of confining the temperature gradient compromises the step of insulating the area of the rotor containing said solid state sample from other areas of the rotor.

6. A method of performing variable-temperature, solid state magnetic resonance spectroscopy as described in claim 5 wherein said step of insulating comprises the step of substantially blocking the ability of any spinning gas to mix with the sample gas in the vicinity of said rotor.

7. A method of performing variable-temperature, solid state magnetic resonance spectroscopy as described in claim 6 wherein said blocking step comprises positioning an annular stator seal around said rotor and in close proximity thereto.

8. A method of performing variable-temperature, solid state magnetic resonance spectroscopy as described in claim 4 wherein said step of insulating the rotor comprises the steps of exhausting said spinning gas away from the area of the rotor containing the solid state sample.

9. A method of performing variable-temperature, solid state magnetic resonance spectroscopy as described in claim 7 wherein said step of insulating the rotor further comprises the steps of:
   a. exhausting said spinning gas away from the area of the rotor containing the solid state sample; and
   b. providing an insulator in the rotor.

10. A method of performing variable-temperature, solid state magnetic resonance spectroscopy as described in claim 8 wherein said spinning gas comprises a drive gas and a bearing gas and wherein said step of insulating further comprises the step of establishing the pressure of said sample gas to be greater than the pressure of the spinning gas adjacent to said sample gas.

11. A method of performing variable-temperature, solid state magnetic resonance spectroscopy as described in claim 10 wherein said bearing gas is adjacent to said sample gas.

12. A method of performing variable-temperature, solid state magnetic resonance spectroscopy as described in claim 10 wherein said drive gas is adjacent to said sample gas.

13. A method of performing variable-temperature, solid state magnetic resonance spectroscopy comprising the steps of:
   a. placing a solid state sample in a rotor;
   b. positioning said rotor within a magnetic field within a probe having a removable end;
   c. spinning said rotor through operation of at least one spinning gas;
   d. creating a temperature gradient among the gases surrounding said rotor to impact the temperature of said solid state sample through operation of a sample gas;
   e. separating the direction from which said spinning gas and said sample gas are supplied to the rotor;
   f. reading the magnetic resonant emissions of said sample.

14. A method of performing variable-temperature, solid state magnetic resonance spectroscopy as described in claim 13 wherein said spinning gas is supplied through said removable end of the probe.

15. A method of performing variable-temperature, solid state magnetic resonance spectroscopy as described in claims 4, 7, or 11 and further comprising the step of separating the direction from which said spinning gas and said sample gas are supplied to the rotor.

16. A method of performing variable-temperature, solid state magnetic resonance spectroscopy as described in claim 15 wherein rotor is positioned within a probe having a removable end and wherein said spinning gas is supplied through the removable end of said probe.

17. A method of performing variable-temperature, solid state magnetic resonance spectroscopy as described in claims 1, 4, 7, or 11 wherein each of said gases supplied are exhausted away from said stator and further comprising the step of combining said exhaust gases into an exhaust tube in the vicinity of said stator.

18. A method of performing variable-temperature, solid state magnetic resonance spectroscopy as described in claim 17 wherein said exhaust tube has a relatively large cross sectional area.

19. A method of performing variable-temperature, solid state magnetic resonance spectroscopy as described in claim 18 wherein said sample gas is supplied through a sample gas supply line having a cross sectional area and wherein said cross sectional area of the exhaust tube is at least as large as the sum of the cross sectional areas of all the gas supply lines.

20. A method of performing variable-temperature, solid state magnetic resonance spectroscopy as described in claim 13 wherein each of said gases supplied are exhausted away from said stator and further comprising the step of combining said exhaust gases into an exhaust tube in the vicinity of said stator.

21. A method of performing variable-temperature, solid state magnetic resonance spectroscopy as described in claim 20 wherein said exhaust tube has a relatively large cross sectional area.

22. A method of performing variable-temperature, solid state magnetic resonance spectroscopy as described in claim 21 wherein said sample gas is supplied through sample gas supply line having a cross sectional area and wherein said cross sectional area of the exhaust tube is at least as large as the sum of the cross sectional areas of all the gas supply lines.

23. A variable-temperature sample spinning mechanism for conducting solid state magnetic resonance spectroscopy comprising:
   a. a rotor designed to contain a solid state sample;
   b. a stator housing surrounding said rotor and to be contained within a magnetic field;
   c. a means for spinning said rotor, said spinning means supplying at least one spin gas against said rotor; and
   d. a means for controlling the temperature of said solid state sample wherein said controlling means is independent of said means for spinning the rotor.

24. A variable-temperature sample spinning mechanism for conducting solid state magnetic resonance spectroscopy as described in claim 23 wherein said spin gas comprises a drive gas and a bearing gas.

25. A variable-temperature sample spinning mechanism for conducting solid state magnetic resonance spectroscopy as described in claim 24 wherein said means for controlling comprises a sample gas which is separate from said spinning gases.

26. A variable-temperature sample spinning mechanism for conducting solid state magnetic resonance spectroscopy as described in claim 25 and further comprising a means for insulating said sample gas from said spinning gases.

27. A variable-temperature sample spinning mechanism for conducting solid state magnetic resonance spectroscopy as described in claim 26 wherein said insulation means comprises an annular stator seal around said rotor and in close proximity thereto.

28. A variable-temperature sample spinning mechanism for conducting solid state magnetic resonance spectroscopy as described in claim 26 wherein said insulation means comprises at least one duct positioned to draw the spinning gases away from said solid state sample.

29. A variable-temperature sample spinning mechanism for conducting solid state magnetic resonance spectroscopy as described in claim 26 wherein said insulation means comprises at least one pressure valve for adjusting the relative pressures of said sample gas and said spinning gases.

30. A variable-temperature sample spinning mechanism for conducting solid state magnetic resonance spectroscopy as described in claim 26 wherein said insulation means comprises:
   a. an annular stator seal around said rotor and in close proximity thereto;
   b. at least one duct positioned to draw the spinning gases away from said solid state sample; and
   c. at least one pressure valve for adjusting the relative pressures of said sample gas and said spinning gases.

31. A variable-temperature sample spinning mechanism for conducting solid state magnetic resonance spectroscopy as described in claim 29 wherein a spinning gas is adjacent to said sample gas and wherein the pressure of said adjacent spinning gas is less than the pressure of said sample gas.

32. A variable-temperature sample spinning mechanism for conducting solid state magnetic resonance spectroscopy as described in claim 31 wherein said adjacent spinning gas is the bearing gas.

33. A variable-temperature sample spinning mechanism for conducting solid state magnetic resonance spectroscopy as described in claim 31 wherein said spinning gas adjacent to said sample gas is the drive gas.

34. A variable-temperature sample assembly for conducting solid state magnetic resonance spectroscopy comprising:
   a. a rotor designed to contain a solid state sample;
   b. a stator housing surrounding said rotor and contained within a magnetic field and within a probe having a removable end;
   c. a means for spinning said rotor, said spinning means supplying at least one spin gas next to said rotor through utilization of at least one spin gas supply line;
   d. a means for controlling the temperature of said solid state sample, said controlling means supplying a sample gas in the vicinity of said solid state sample through a sample gas supply line; and
wherein said sample gas supply line and said spin gas supply line approach the rotor from opposite directions.

35. A variable-temperature sample assembly for conducting solid state magnetic resonance spectroscopy as described in claim 34 wherein said spin gas supply line is fed through said removable end of the probe.

36. A variable-temperature sample spinning mechanism for conducting solid state magnetic resonance spectroscopy as described in claims 25, 27, or 32 wherein said sample gas and said spinning gas are supplied in the vicinity of the rotor from opposite directions.

37. A variable-temperature sample spinning mechanism for conducting solid state magnetic resonance spectroscopy as described in claim 36 wherein said rotor is positioned within a probe having a removable end and wherein said spinning gas is fed through said removable end of the probe.

38. A variable-temperature sample spinning mechanism for conducting solid state magnetic resonance spectroscopy as described in claims 23, 25, 27, or 32 and further comprising an exhaust junction connected so to combine at least two exhaust gases and so as to feed an exhaust tube.

39. A variable-temperature sample spinning mechanism for conducting solid state magnetic resonance spectroscopy as described in claim 38 wherein said exhaust tube has a relatively large cross sectional area.

40. A variable-temperature sample spinning mechanism for conducting solid state magnetic resonance spectroscopy as described in claim 39 wherein all of said gases are supplied through gas supply lines, each having a cross sectional area, and wherein said cross sectional area of the exhaust tube is at least as large as the sum of all the cross sectional areas of said supply lines.

41. A variable-temperature sample assembly for conducting solid state magnetic resonance spectroscopy as described in claim 34 and further comprising an exhaust junction connected so to combine at least two exhaust gases and so as to feed an exhaust tube.

42. A variable-temperature sample assembly for conducting solid state magnetic resonance spectroscopy as described in claim 41 wherein said exhaust tube has a relatively large cross sectional area.

43. A variable-temperature sample assembly for conducting solid state magnetic resonance spectroscopy as described in claim 42 wherein all of said gases are supplied through gas supply lines, each having a cross sectional area, and wherein said cross sectional area of the exhaust tube is at least as large as the sum of all the cross sectional areas of said supply lines.

* * * * *